United States Patent [19]
Zhou et al.

[11] Patent Number: 6,025,752
[45] Date of Patent: Feb. 15, 2000

[54] INVERTING AMPLIFYING CIRCUIT

[75] Inventors: Changming Zhou; Guoliang Shou; Shengmin Lin; Takashi Tomatsu; Jie Chen, all of Tokyo, Japan

[73] Assignee: Yozan Inc., Tokyo, Japan

[21] Appl. No.: 09/087,924

[22] Filed: Jun. 1, 1998

[30] Foreign Application Priority Data

| Jun. 2, 1997 | [JP] | Japan | 9-157346 |
| Jun. 5, 1997 | [JP] | Japan | 9-163379 |
| Jul. 7, 1997 | [JP] | Japan | 9-196535 |

[51] Int. Cl.[7] .................................................. H03F 1/14
[52] U.S. Cl. ........................................... 330/51; 330/294
[58] Field of Search ................................. 330/51, 9, 277, 330/294

[56] References Cited

U.S. PATENT DOCUMENTS

| 4,453,130 | 6/1984 | Bennett | 330/51 |
| 4,538,113 | 8/1985 | Lish | 330/126 |
| 4,647,865 | 3/1987 | Westwick | 330/51 |
| 5,585,756 | 12/1996 | Wang | 327/341 |

*Primary Examiner*—Robert Pascal
*Assistant Examiner*—Henry Choe
*Attorney, Agent, or Firm*—Pillsbury Madison & Sutro LLP

[57] ABSTRACT

An inverting amplifying circuit for outputting an inversion of an input with good linearity, having an inverter circuit, a feedback capacitance, an input capacitance, a first refresh switch, a second refresh switch, a sleep switch, and a first cutoff switch. A sleep voltage is input through the sleep switch to the inverter circuit for minimizing the electrical power consumption. The sleep switch connects a terminal of the inverter circuit directly to ground when in a sleep mode. The first cut off switch is connected between an output of the inverter circuit and an output of the inverting amplifying circuit.

23 Claims, 12 Drawing Sheets

INVERTING AMPLIFYING CIRCUIT

FIELD OF THE INVENTION

The present invention relates to an inverting amplifying circuit, particularly to an inverting amplifying circuit having an odd number of CMOS inverters serially connected from the first stage to the last stage. An output of the last stage CMOS inverter is fed through a feed back capacitance back to an input of the first stage. An input voltage is input through an input capacitance to the input of the first stage CMOS.

DESCRIPTION OF RELATED ART

The inverting amplifying circuit of this type is advantageous for transferring the input voltage with drive-ability, high accuracy and good linearity to the output when analog voltage calculation is performed.

FIG. 23 shows a conventional inverting amplifying circuit. A feedback capacitance CF is connected between input and output of inverting circuit I consisting of odd number of CMOS inverters serially connected. The output of the inverting circuit I is connected through a switch SW7 to the capacitance CF, and the input is connected to an input capacitance CI. An analog input voltage AIN is connected to CI through a switch SW4 which is controlled by a clock CLK. A switch SW8 is connected through a switch SW3 between SW4 and CI so that CF is short-circuited by SW2. The switch SW8 connects a refresh voltage VREF or the ground voltage to SW3. VREF is selected when refreshed, and the ground voltage is selected in sleep mode for preventing electrical power consumption. When refreshed, both of SW2 and SW3 are closed and SW8 selects VREF so that VREF is applied to CI and CF is short-circuited. VREF is equal to a threshold voltage Vd/2 (Vd: a supply voltage of the inverter) of the inverter circuit, so Vd2 is generated at the input of the inverter circuit I when CF is short-circuited. The voltages of input and output are equal to each other of not only CF but also of CI. A residual charge is cancelled. An offset voltage due to the residual charge is deleted and a calculation is accurate. The input of the inverter circuit is connected through SW1 to SW8. When in sleep mode, SW1 is closed, SW7 is connected to SW8 and SW8 is connected to the ground, and then the input of the inverter is connected to the ground. SW2 is opened. The electrical power consumption of the inverter is stopped.

The inverting amplifying circuit above is accurate in calculation and of low electrical power consumption. However, lower power consumption as well as smaller circuit size are required.

FIG. 24 shows an inverting amplifying circuit proposed in the patent publication before examination Hei07-094957. In the circuit, similar portions to those in FIG. 23 are designated by the same references, and descriptions therefor are omitted. The inverter circuit I consists of three CMOS inverters 151 to 153 serially connected. A serial circuit of a resistance R and a capacitance Cm is connected between the first and second stages 151 and 152 for preventing unexpected and unstable oscillation by its phase compensation function. There is a problem that an output voltage AOUT has an offset voltage which occurs when thresholds of nMOS and pMOS of each CMOS are different due to production errors.

SUMMARY OF THE INVENTION

The present invention solves the conventional problem and has an object to provide an inverting amplifying circuit of lower power consumption and high accuracy.

An inverting amplifying circuit according to the present invention has a sleep switch for connecting an input of a inverting circuit to the ground voltage.

PREFERRED EMBODIMENT OF THE PRESENT INVENTION

Figure 1:
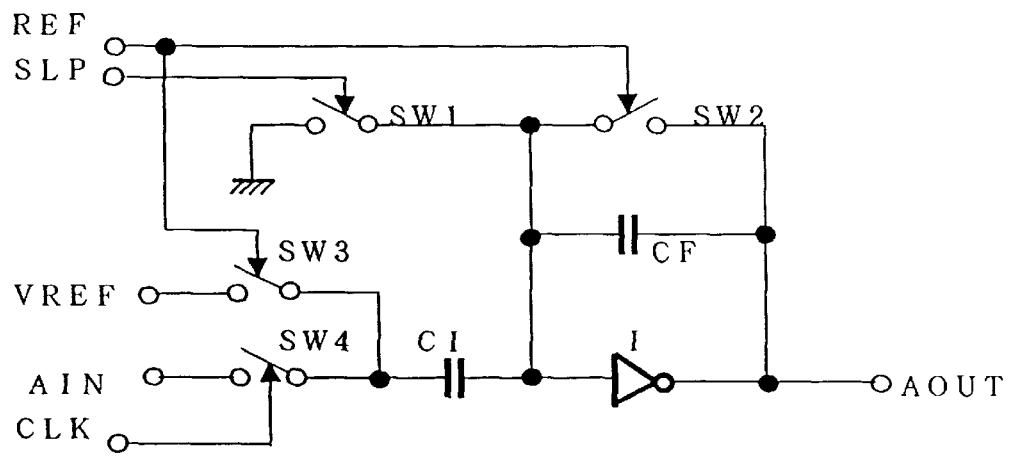
FIG. 1 is a circuit diagram of the first embodiment according to the present invention.

FIG. 1 show illustrates the first embodiment of the present invention and shows an inverting amplifying circuit. The inverter circuit I has odd number of CMOS inverters, typically three CMOS inverters. An output of the circuit I is connected through a feedback capacitance CF to an input thereof. An input capacitance CI is connected to the input of I, and an input voltage AIN is connected through a switch SW4 to CI. The switch SW4 is controlled by a clock CLK.

A refresh switch SW2 is connected to opposite terminals of CF so that an electrical charge of CF is cancelled because CF is short-circuited. Then, the input and output of the inverter circuit I is short-circuited when SW2 is closed, so a threshold voltage of the inverter circuit occurs at the input and output of I. A refresh voltage VREF is connected through a refresh switch SW3 to an input of CI. The input and output of CI are driven by the same voltage. An electrical charge is cancelled in CI. The threshold voltage is designed to be Vd/2, a half of a supply voltage Vd. The refresh switch is controlled by a refresh signal REF. In addition, the switch SW1 is opened when the circuit is in refresh mode.

A sleep switch SW1 connected to the ground is connected to an input of the inverter circuit. The ground voltage is connected through SW1 to the input of I when SW1 is closed. In sleep mode, the inverter circuit becomes saturated so that a current through the CMOSs is prevented. An electrical power consumption is stopped. The switch SW1 is controlled by a sleep signal SLP. In addition, the switch SW2 is opened when the circuit is in sleep mode.

The circuit is simplified by omitting the switch SW7 in the conventional circuit. The circuit size and the production cost are decreased and the yielding is improved. The sleep switch can be the supply voltage Vd instead of the ground.

Figure 2:
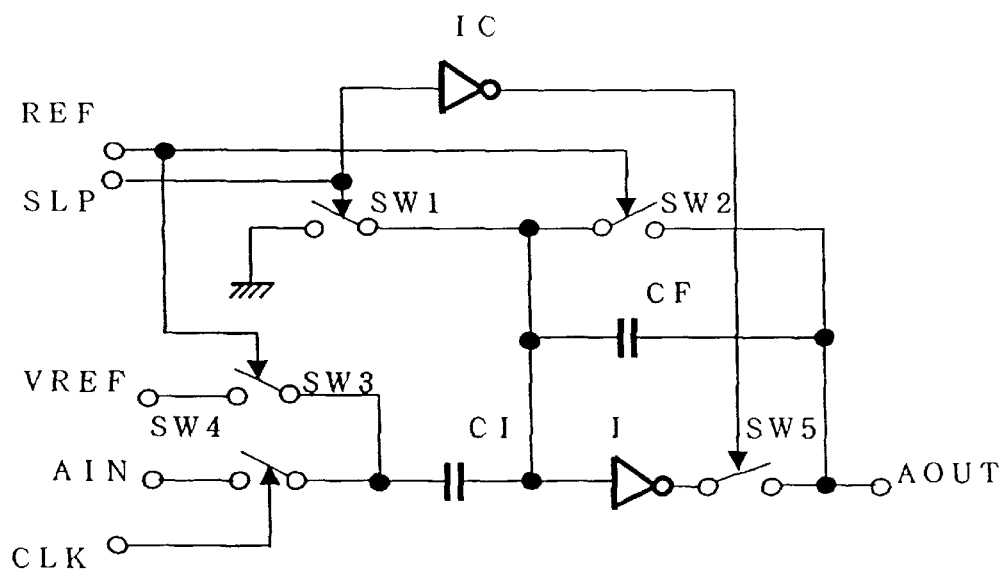
FIG. 2 is a circuit diagram of the second embodiment.

FIG. 2 shows the second embodiment, in which similar portions to those in FIG. 1 are designated by the same references and the descriptions therefor are omitted. A switch SW5 is provided between the outputs of the inverter circuit I and the feedback capacitance in addition to the circuit of FIG. 1. The switch SW5 is opened when sleep mode so that the output of the inverter circuit I is disconnected from the output for outputting the analog output voltage AOUT of the inverting amplifying circuit. For this inverted control logic, the sleep signal is supplied through an inverter IC. The output of I is Vd when in sleep mode. This voltage is not transferred to the circuits following the inverting amplifying circuit so that the circuits are not influenced by the voltage Vd. The supply voltage may be connected to the sleep switch instead of the ground voltage.

Figure 3:
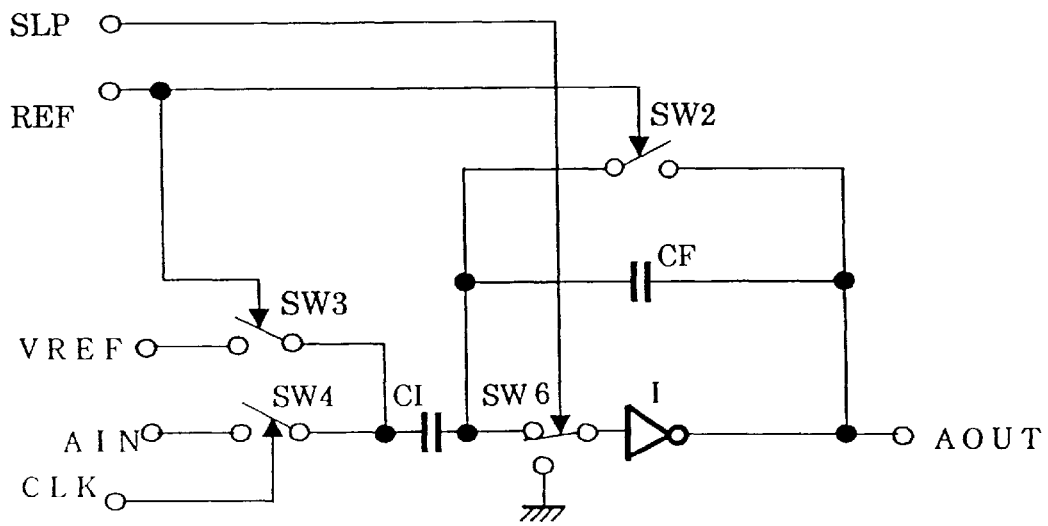
FIG. 3 is a circuit diagram of the third embodiment.

FIG. 3 shows the third embodiment, in which similar portions to those in FIG. 1 are designated by the same references and the descriptions therefor are omitted. A switch SW6 is provided between the input of the inverter circuit I and the output of the input capacitance instead of the sleep switch of FIG. 1. The switch SW6 connects the input of the inverter circuit to the output of CI or the ground. The ground is selected when in sleep mode so that the input of the inverter circuit I is disconnected from circuits in advance to the inverting amplifying circuit. The ground voltage connected to the inverter circuit is not transferred to the circuits so that the circuits are not influenced by the ground voltage. The input of the capacitance CF is connected to between CI and SW6 in FIG. 3, however, it may be connected between SW6 and the inverter circuit Since the capacitances CI and CF are directly connected in FIG. 3, it is advantageous that these capacitances can be adjacently arranged in an integrated circuit.

Figure 4:
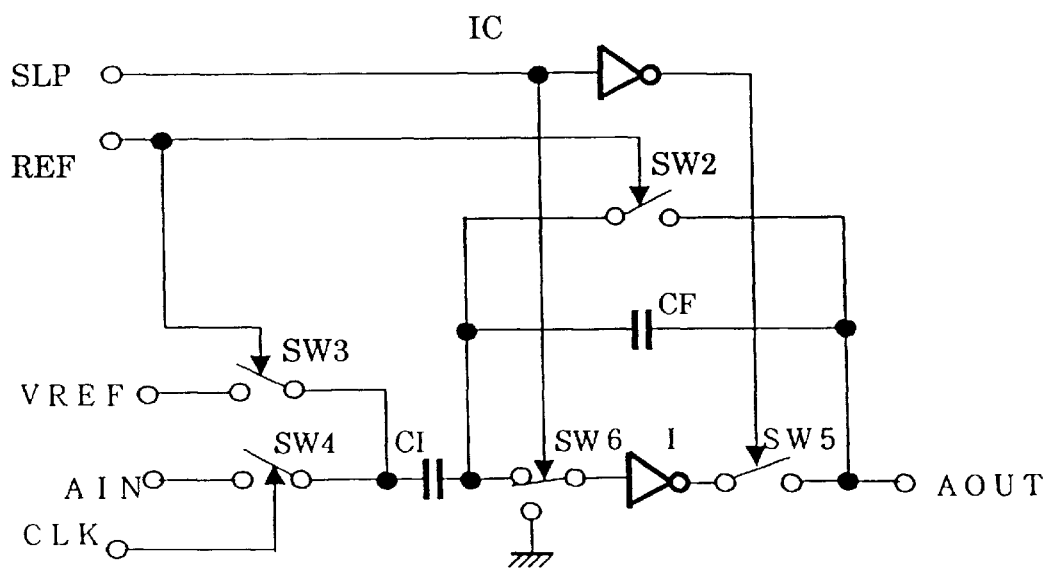
FIG. 4 is a circuit diagram of the fourth embodiment.

FIG. 4 shows the fourth embodiment, in which similar portions to those in FIG. 1 are designated by the same references and the descriptions therefor are omitted. Both of the switches SW5 and SW6 are used for preventing unwanted interference with the circuits following the inverting amplifying circuit.

Figure 5:
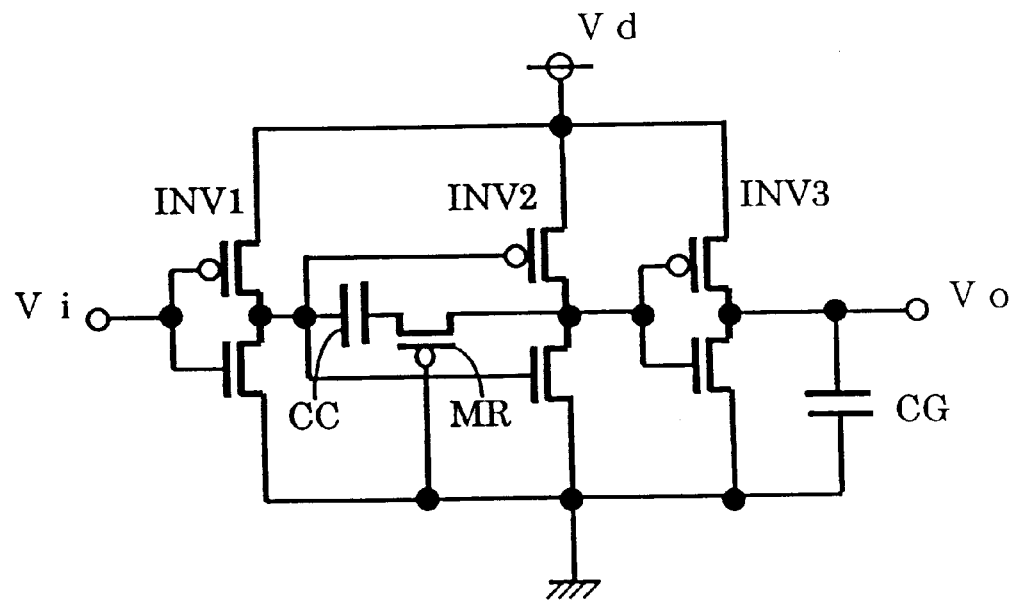
FIG. 5 is a circuit diagram of an inverter circuit in the embodiments above.

FIG. 5 shows the inverter circuit I used in the above embodiments. The inverter circuit I has three CMOS inverters INV1, INV2 and INV3 serially connected. A phase compensation circuit is connected to the second inverter INV2 consisting of a capacitance CC and a MOS resistance MR serially connected. The phase compensation circuit increases a phase margin of the feedback system consisting of the inverter circuit I and the feedback capacitance CF. A grounded capacitance is connected to an output of the third stage inverter INV3 for preventing unexpected and unstable oscillation by reducing a high frequency component.

Figure 6:
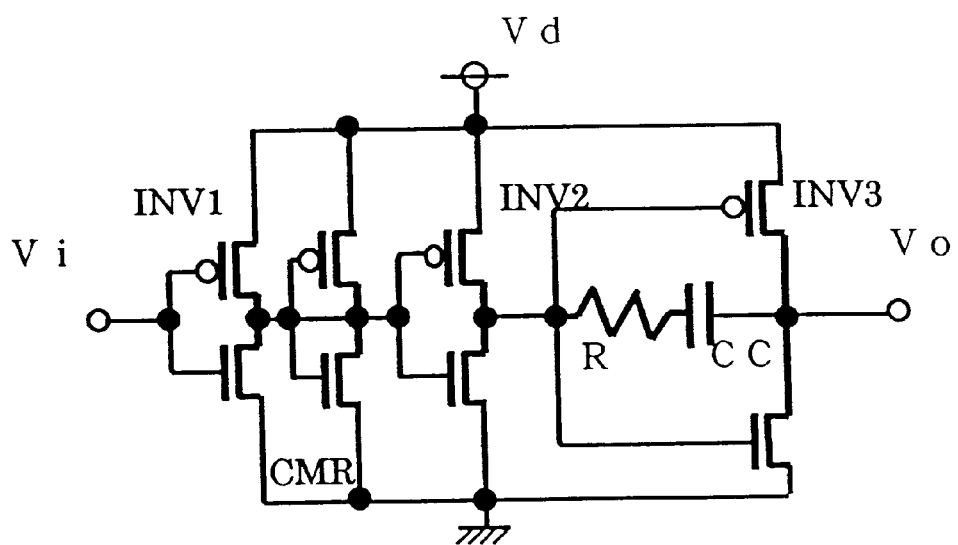
FIG. 6 shows another inverter circuit.

FIG. 6 shows another inverter circuit A CMOS resistance CMR is connected between the first stage INV1 and the second stage INV2. A phase compensation circuit is connected between the input and output of the third stage inverter INV3. The phase compensation circuit consists of a capacitance CC and a resistance R serially connected. The phase compensation circuit increases a phase margin of the feedback system consisting of the inverter circuit I and the feedback capacitance CF.

Figure 7:
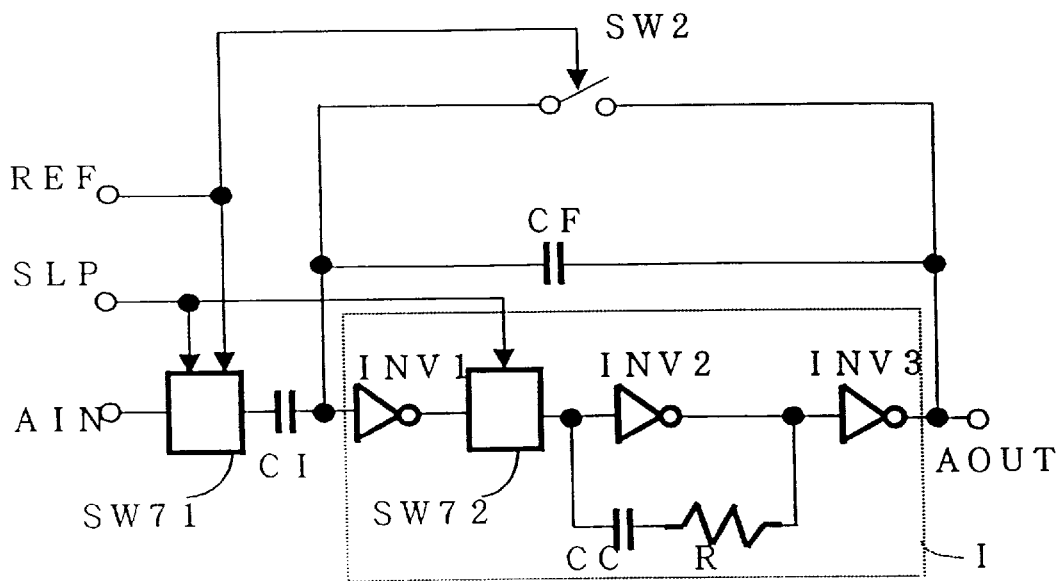
FIG. 7 shows the fifth embodiment.

FIG. 7 shows the fifth embodiment, in which similar portions to those in FIG. 1 are designated by the same references and the descriptions therefor are omitted. A switch SW71 having three inputs and one output is connected to the input of the input capacitance, and a switch SW72 having two inputs and one output is connected between the first and second inverters INV1 and INV2. Similar to the circuit in FIG. 5, a phase compensation circuit is connected between the input and output of the inverter INV2. The switch SW2 is dosed both in the refresh mode and the sleep mode.

Figure 8:
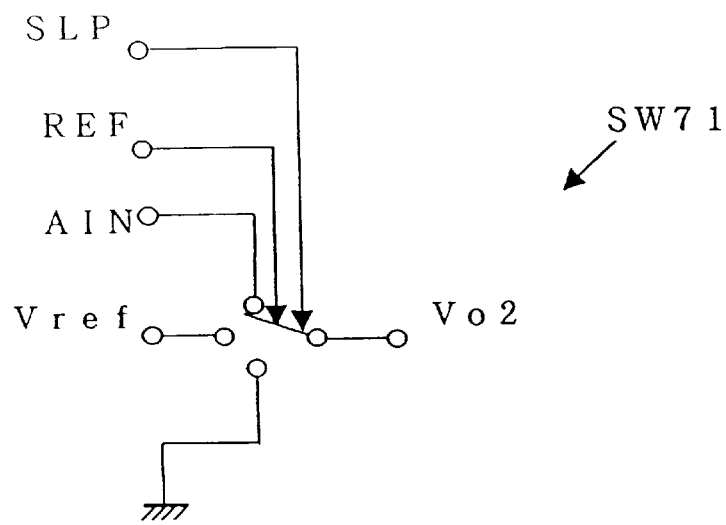
FIG. 8 is a circuit diagram of a switch in FIG. 7.

As shown in FIG. 8, the switch SW71 is controlled by the signal REF and SLP so that its input is connected to the ground when SLP is valid, to Vref when REF is valid and otherwise to AIN. The switch SW71 can be omitted because the input voltage of the inverter circuit I is ground when SW2 is closed.

Figure 10:
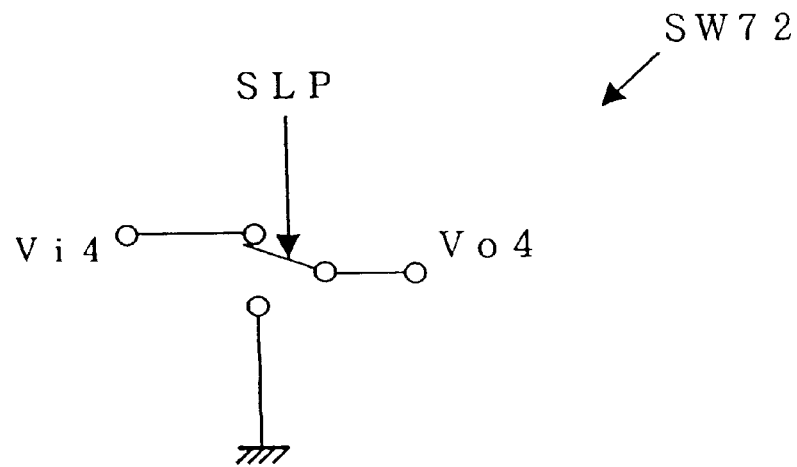
FIG. 10 shows further another switch.

As shown in FIG. 10, the switch SW72 is controlled by SLP so that the input is connected to the ground when SLP is valid and otherwise to the output (shown by Vi4) of INV1. SW71 is also connected to the ground when SLP is valid. In this case CMOS inverters INV1 to INV3 become saturated area so that the electrical power consumption is stopped.

Figure 9:
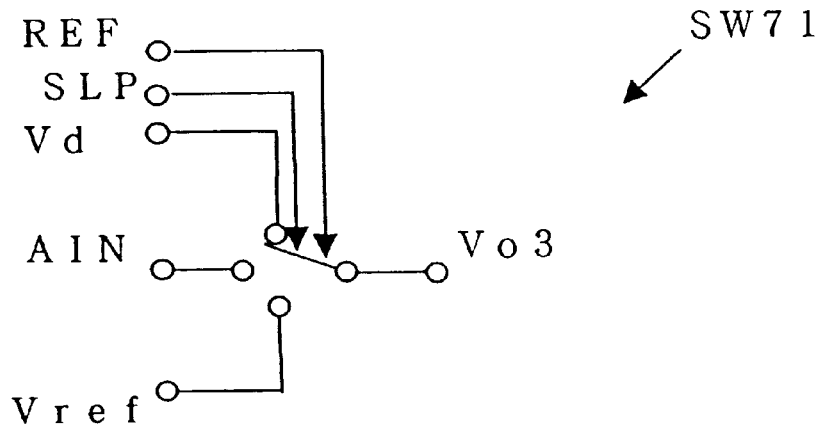
FIG. 9 is a circuit diagram of a variation of the switch in FIG. 8.
Figure 11:
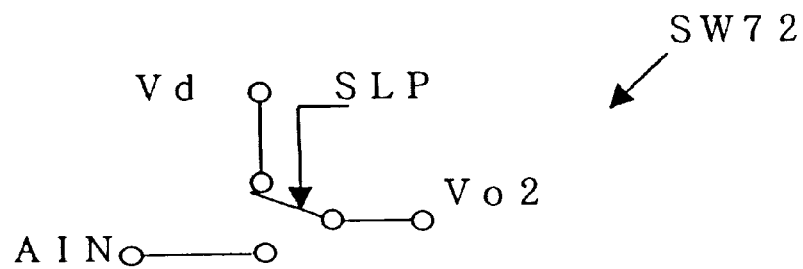
FIG. 11 shows a variation of the switch in FIG. 10.

FIG. 9 shows a variation of the switch SW71. Instead of the ground, the supply voltage Vd is connected to the input of SW71. A similar effect is obtained. FIG. 11 shows a variation of the switch SW72 which is connected at its input to the supply voltage Vd instead of to ground. The switches SW71 and SW72 have corresponding polarities. The circuits of FIG. 8 and FIG. 10 correspond to each other, and FIG. 9 and FIG. 11 correspond to each other.

Figure 12:
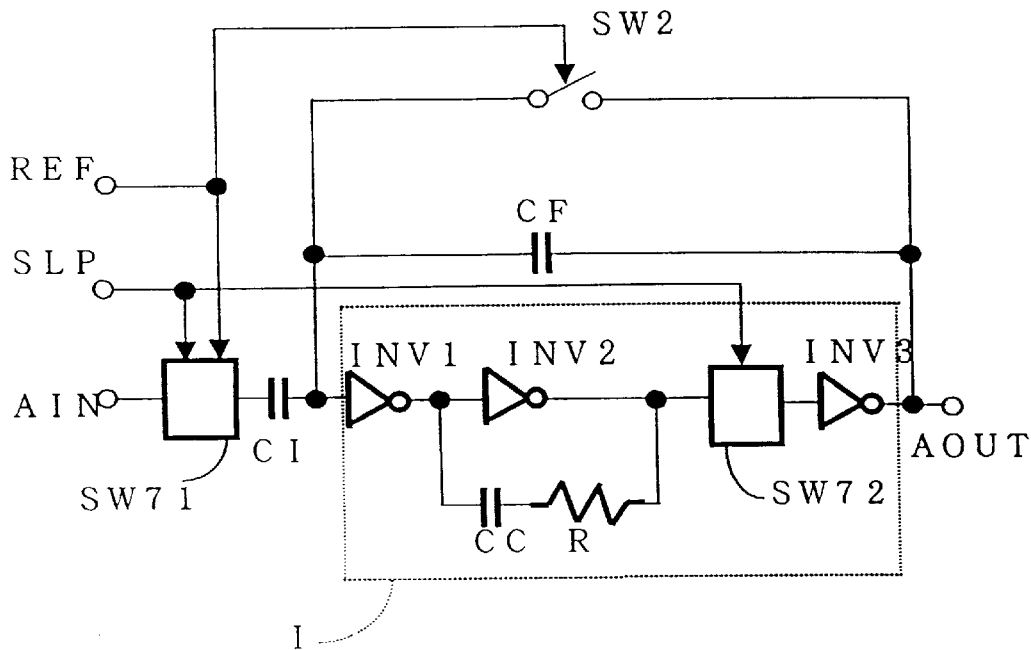
FIG. 12 is a circuit diagram of the sixth embodiment.

FIG. 12 shows the sixth embodiment, in which similar portions to those in FIG. 7 are designated by the same references and the descriptions therefor are omitted. The switch SW72 of two inputs and one output is connected between the second and third inverters INV2 and INV3. A similar effect is obtained. As for polarities of the switches, SW72 is connected to Vd when SW71 is connected to the ground, and SW72 is connected to the ground when SW71 is connected to Vd. The switch SW2 is closed both in the refresh mode and sleep mode.

Figure 13:
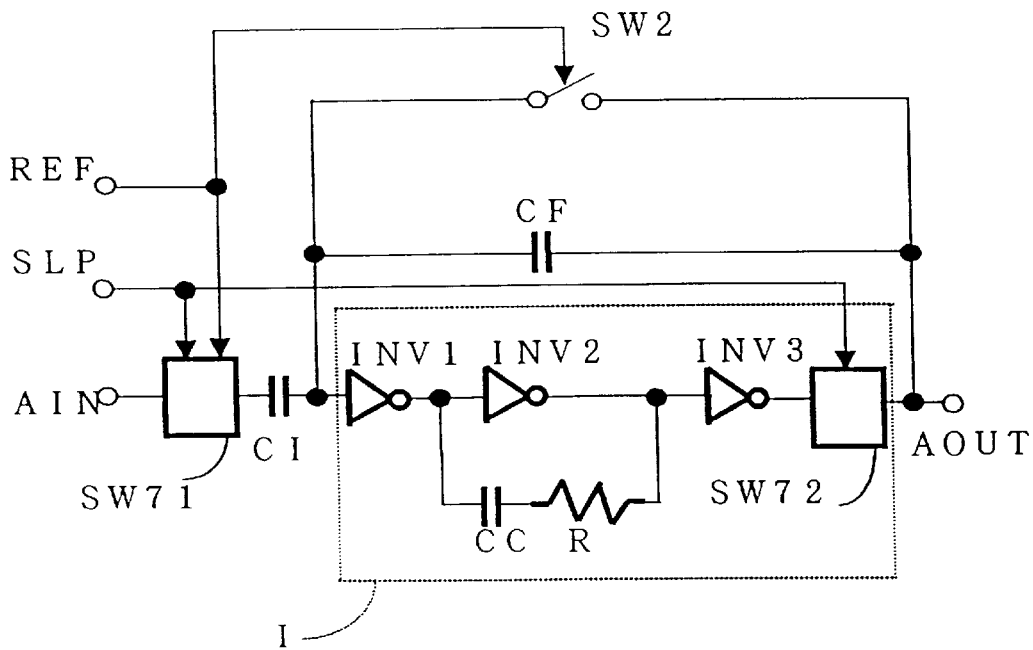
FIG. 13 shows the seventh embodiment.

FIG. 13 shows the seventh embodiment, in which similar portions to those in FIG. 7 are designated by the same references and the descriptions therefor are omitted. The switch SW72 is connected to the output of the third inverter INV3. A similar effect is obtained. As for polarities of the switches, SW72 is connected to the ground when SW71 is connected to the ground, and SW72 is connected to Vd when SW71 is connected to Vd.

Figure 14:
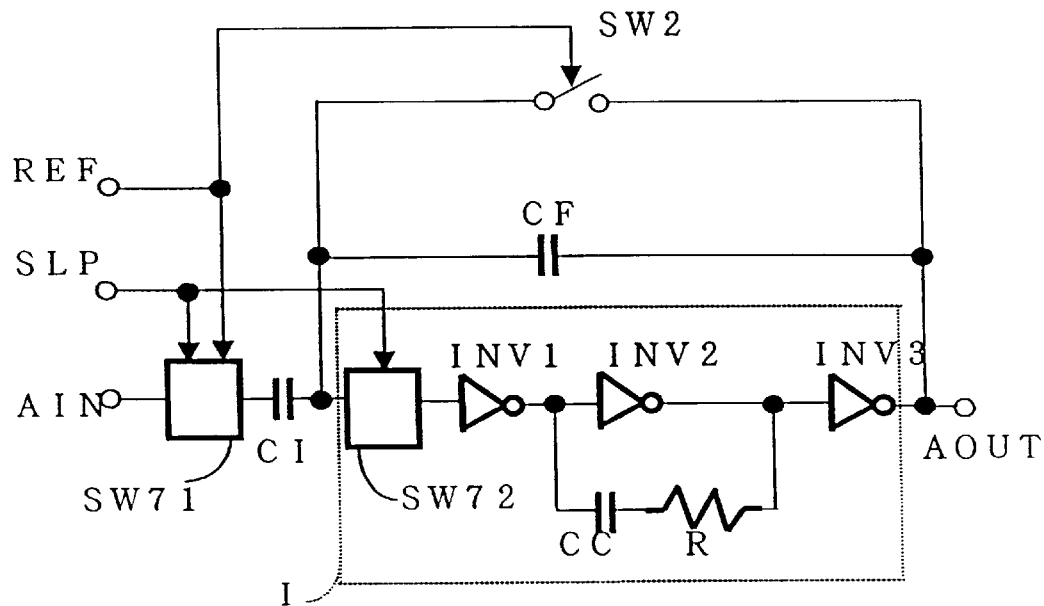
FIG. 14 shows the eighth embodiment.

FIG. 14 shows the seventh embodiment, in which similar portions to those in FIG. 7 are designated by the same references and the descriptions therefor are omitted. The switch SW72 is connected to the input of the inverter INV1. A similar effect is obtained. As for polarities of the switches, SW72 is connected to Vd when SW71 is connected to the ground, and SW72 is connected to the ground when SW71 is connected to Vd.

Figure 15:
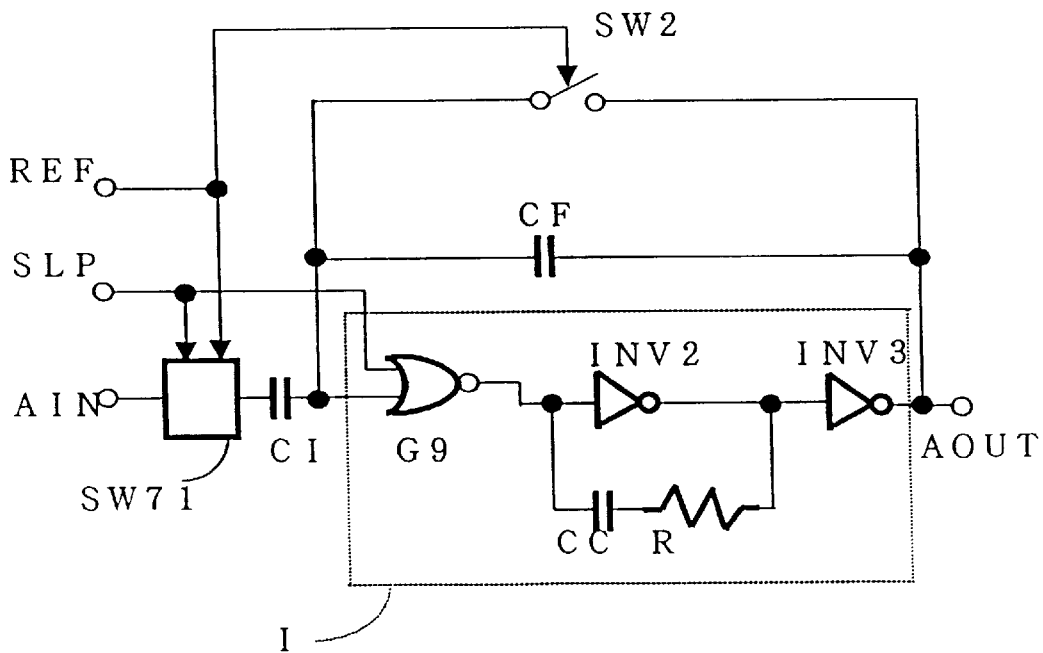
FIG. 15 shows the ninth embodiment.

FIG. 15 shows the eighth embodiment, in which similar portions to those in FIG. 7 are designated by the same references and the descriptions therefor are omitted. Instead of INV1, a NOR gate G9 is connected between CI and INV2. The gate G9 receives the output of CI and SLP so as to invert the output of CI when SLP is invalid, that is, not in sleep mode. The gate G9 outputs "0" when SLP is valid so as to connect the input of INV2 to the ground. The gate inverts small voltage change of the output of CI substantially equal to Vd/2. Any gate circuits equivalent to the gate G9 can be applied, and one or both of the second and third inverters INV2 and INV3 can be substituted by the gate circuits. The output of the date G9 should have polarity corresponding to the circuits FIGS. 8 and 9, similarly to the above. When INV1 or INV3 is substituted by G9, the switch SW71 of FIG. 8 is used, and when INV2 is substituted by G9, the switch of FIG. 9 is used. The switch for sleep mode is omitted by using the gate circuit, so the circuit size becomes smaller.

Figure 16:
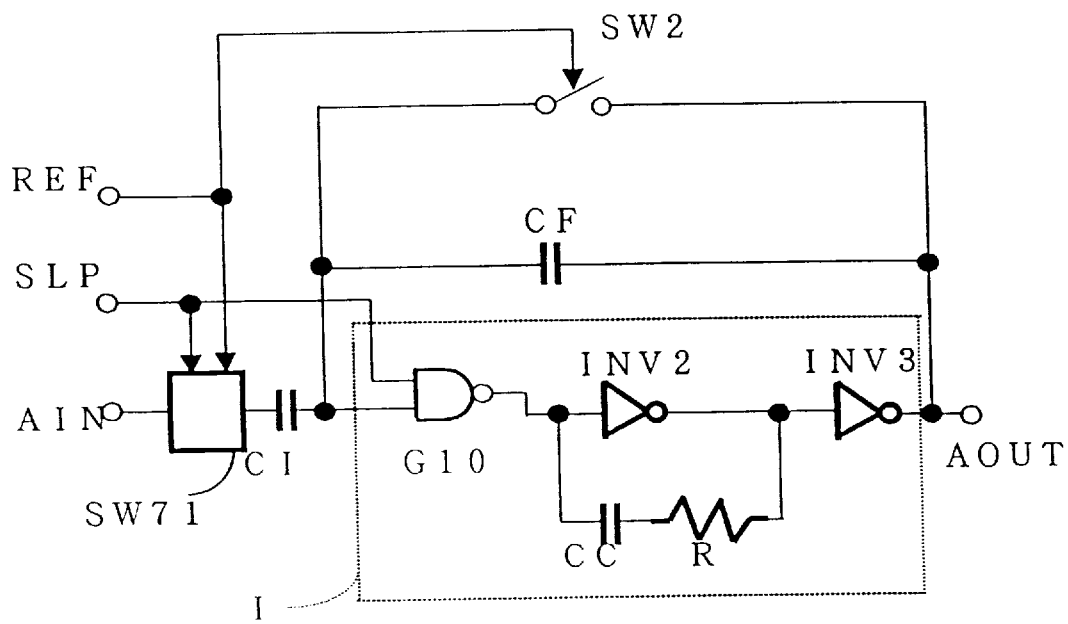
FIG. 16 shows the tenth embodiment.

FIG. 16 shows the ninth embodiment, in which similar portions to those in FIG. 7 are designated by the same references and the descriptions therefor are omitted. Instead of INV1, a NAND gate G10 is connected between CI and INV2. The gate G9 receives the output of CI and SLP so as to invert the output of CI when SLP is invalid, that is, not in sleep mode. The gate G9 outputs "1" when SLP is valid so as to connect the input of INV2 to Vd. The gate inverts small voltage change of the output of CI substantially equal to Vd/2. Any gate circuits equivalent to the gate G10 can be applied, and one or both of the second and third inverters INV2 and INV3 can be substituted by the gate circuits. The output of the date G9 should have polarity corresponding to the circuits FIGS. 8 and 9, similarly to the above. The switch for sleep mode is omitted by using the gate circuit, so the circuit size becomes smaller.

Figure 17:
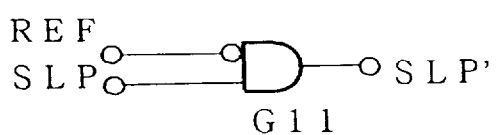
FIG. 17 shows a gate circuit for providing a sleep signal.

FIG. 17 shows a circuit for generating a control signal of sleep mode. The circuit has an AND gate G11 for receiving SLP and an inversion of REF. When REF is invalid, an signal SLP' equal to SLP is output, and when REF valid, SLP' is always "0". This means that the sleep signal SLP' is superior to the refresh signal. The sleep operation is executed without fail if the sleep signal is independently generated from REF.

Figure 18:
FIG. 18 shows a variation of the circuit in FIG. 17.

FIG. 18 shows another circuit for SLP'. There is provided an OR gate G12 for receiving SLP and REF. If both of the CI and CMOS inverters are connected to the ground when both in the refresh and sleep mode, this circuit is advantageous.

Figure 19:
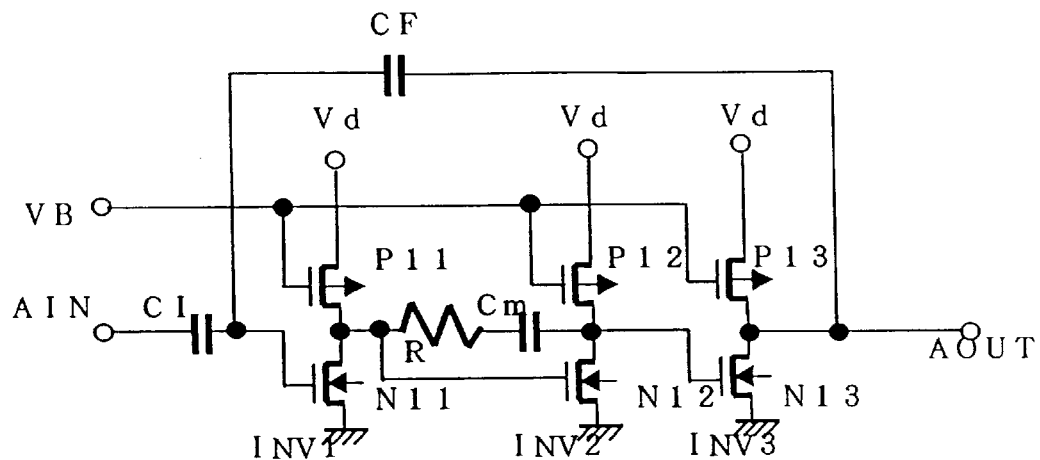
FIG. 19 shows the eleventh embodiment.

FIG. 19 shows the tenth embodiment, in which similar portions to those in FIG. 7 are designated by the same references and the descriptions therefor are omitted. The CMOS inverters INV1 to INV3 consist of pMOS and nMOS transistors P11 and N11, P12 and N12 and P13 and N13, respectively. The output of CI is connected only to the gate of nMOS N11 without being connected to the pMOS P11. The output of INV1 is connected only to the gate of nMOS N12 without being connected to the pMOS P12, and the output of INV2 is connected only to the gate of nMOS N13 without being connected to the pMOS P13. The pMOSs P11 to P13 are connected at their gate to a common bias voltage VB.

When VB is constant, P11 to P13 function as a constant current source having a constant current between the source and drain. The current changes as VB changes. The voltage drop in nMOSs can be changed so as to decreased the offset voltage.

Figure 24:
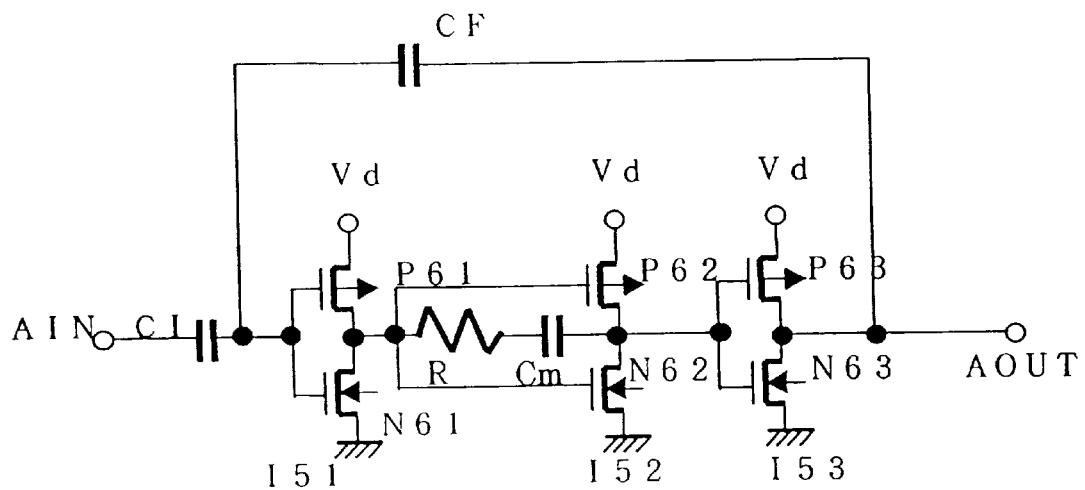
FIG. 24 shows another conventional circuit.

Table 1 shows a relationship between the threshold voltages of nMOS and pMOS and the offset voltage of the circuit of FIG. 24 and a relationship between the offset voltage and the bias voltage.

TABLE 1

Offset Voltage and Bias Voltage

| | Circuit of FIG. 24 | Circuit of FIG. 9 | |
|---|---|---|---|
| Threshold Voltage | Offset Voltage | Bias Voltage | Offset Voltage |
| pMOS and nMOS have typical thresholds | −2.5 mV | 1.520 V | −0.10 mV |
| pMOS has low threshold and nMOS has high threshold | 363.0 mV | 2.176 V | 0.50 mV |
| pMOS has high threshold and nMOS has low threshold | −361.0 mV | 0.478 V | 0.02 mV |

As will be understood from Table 1, the typical threshold of −2.5 mV is decreased y the bias voltage to −0.10 mV. The offset voltage of 363 mV is decreased to 0.50 mV when the threshold of nMOS is high, and −361 mV to 0.02 mV when the threshold of pMOS is high. The offset voltage is substantially cancelled by the bias voltage. The bias voltages for the conditions in Table 1 are 1.520 V, 2.176 V and 0.478 V from the top to the bottom.

A function of MOS resistance for the phase compensation circuit can be obtained by the pMOS changeable in the current from the source to the drain. This means that the phase compensation circuit can be smaller or omitted.

Figure 20:
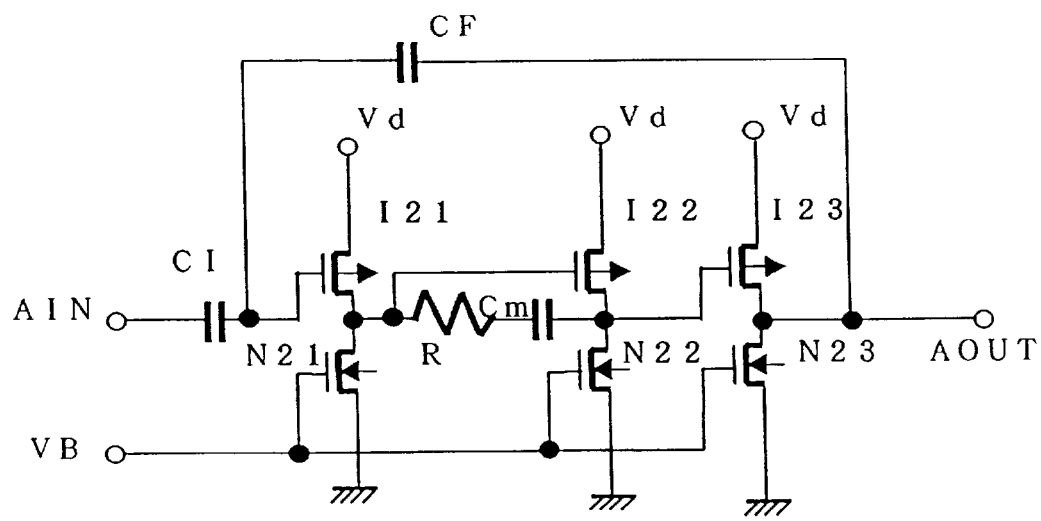
FIG. 20 shows the twelfth embodiment.

FIG. 20 shows the eleventh embodiment, in which similar portions to those in FIG. 19 are designated by the same references and the descriptions therefor are omitted. The relationship between the pMOSs and nMOSs are inverted. The analog input voltage AIN is input to the gate of pMOS P21, the output of P21 is input to the gate of P22, and the output of P22 is input to P23. VB is commonly input to the gate of N21, N22 and N23.

When VB is constant, N21 to N23 function as a constant current source having a constant current between the drain and source. The current changes as VB changes. The voltage drop in pMOSs can be changed so as to decrease the offset voltage.

Figure 21:
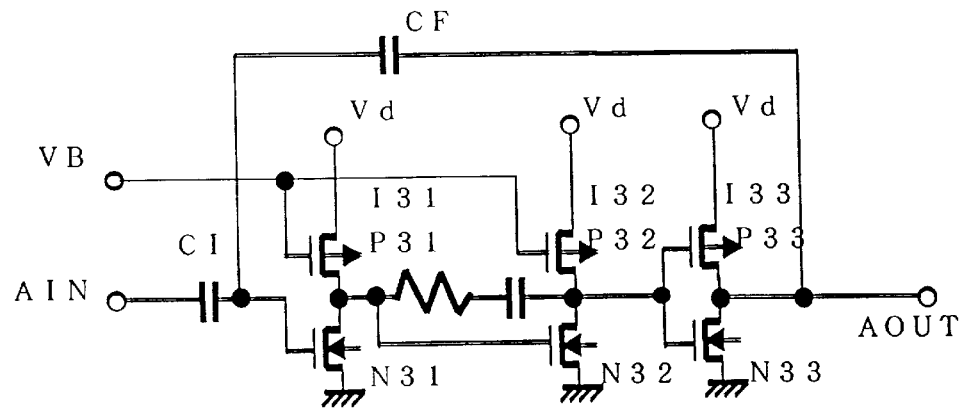
FIG. 21 shows the thirteenth embodiment.

FIG. 21 shows the twelfth embodiment, in which similar portions to those in FIG. 19 are designated by the same references and the descriptions therefor are omitted. The first and second CMOS inverters INV1 and INV2 are similar to those in FIG. 19. The third CMOS inverter INV3 is similar to that in FIG. 24. The dynamic range of the last stage inverter is increased in this embodiment wider than the circuits of FIGS. 19 and 20.

Figure 22:
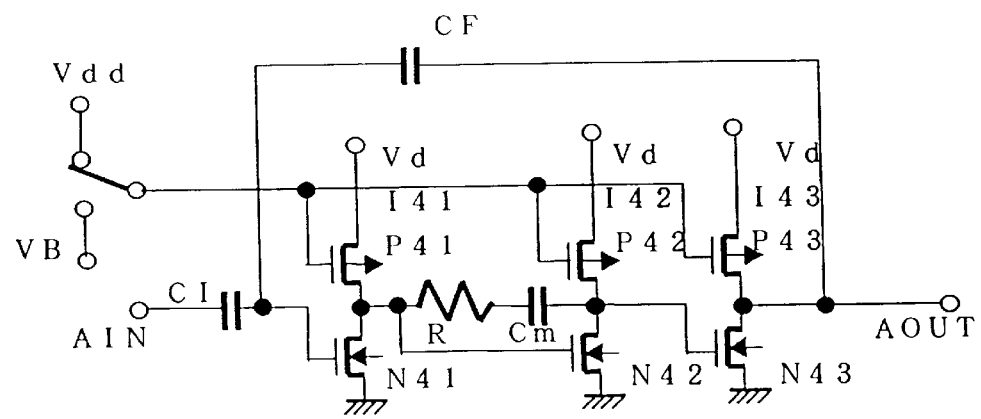
FIG. 22 shows the fourteenth embodiment.
Figure 23:
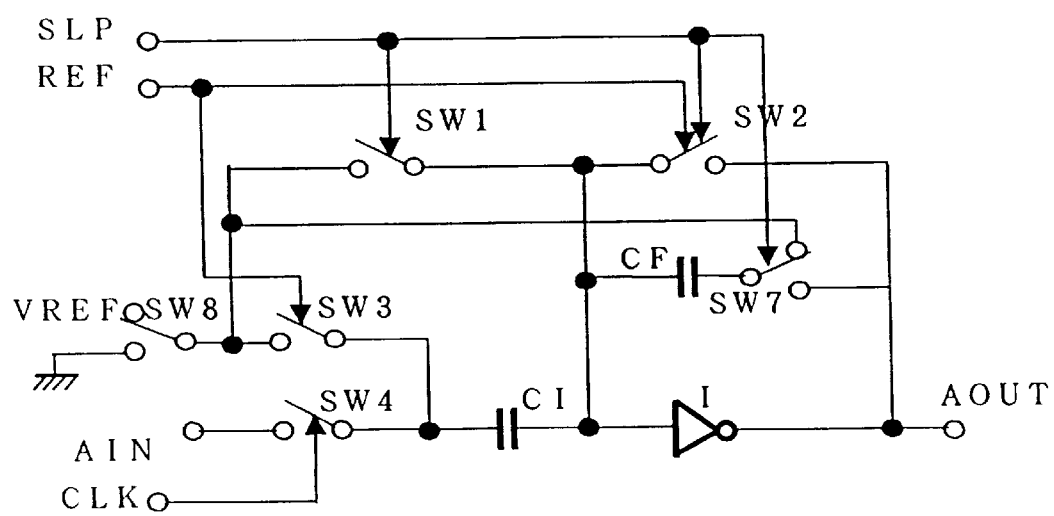
FIG. 23 shows a conventional inverting amplifying circuit.

FIG. 22 shows the thirteenth embodiment, in which similar portions to those in FIG. 19 are designated by the same references and the descriptions therefor are omitted. A switch SWB is provided in addition to the circuit of FIG. 19. The switch SWB receives VB and Vd for alternatively inputting VB or Vd to the gate of pMOSs p41 to p43. When Vd is connected, pMOSs are not conductive and the electrical power is cut off.

It is also possible nMOSs are used instead of pMOSs as the constant current source in the circuit of FIG. 22.

The scope of the invention should be determined by the appended claims and their legal equivalents, rather than by the examples given.

What is claimed is:

1. An inverting amplifying circuit comprising:
    an inverter circuit having an input and an output, said inverter circuit comprising an odd number of CMOS inverters serially connected;

a feedback capacitance connected in parallel with said inverter circuit;

an input capacitance connected to said input of said inverter circuit for inputting a voltage to said inverter circuit;

a first refresh switch connected in parallel with said feedback capacitance for short-circuiting said feedback capacitance when in a refresh mode;

a second refresh switch connected to said input capacitance for inputting a refresh voltage equal to a threshold voltage of said inverter circuit to said input of said inverter circuit when in the refresh mode; and a first sleep switch which connects a ground voltage or to a saturation voltage directly to a terminal of one of said CMOS inverters of said inverter circuit when n a sleep mode.

2. An inverting amplifying circuit as claim 1, wherein said first sleep switch is connected to an input of said inverter circuit.

3. An inverting amplifying circuit as claimed in claim 1, wherein said first sleep voltage is a ground voltage.

4. An inverting amplifying circuit as claimed in claim 1, wherein said first sleep voltage is a supply voltage.

5. An inverting amplifying circuit as claimed in claim 1, further comprising a first cut-off switch connected between said output of said inverter circuit and an output of said inverting amplifying circuit, said cut-off switch being opened when in the sleep mode.

6. An inverting amplifying circuit as claimed in claim 1, further comprising a second cutoff switch which selectively connects said input of said inverter circuit to a saturation voltage when in the sleep mode or otherwise to said output of said input capacitance.

7. An inverting amplifying circuit as claimed in claim 1, wherein said saturation voltage is a ground voltage.

8. An inverting amplifying circuit as claimed in claim 1, wherein said saturation voltage is a supply voltage.

9. An inverting amplifying circuit as claimed in claim 1, further comprising a second sleep switch connected to said input of said input capacitance for connecting a second sleep voltage to said input capacitance when in the sleep mode, said first and second sleep voltages corresponding to a polarity relationship between said terminal of said CMOS inverter and said input of said input capacitance.

10. An inverting amplifying circuit comprising:

an inverter circuit having an input and an output, said inverter circuit comprising an odd number of CMOS inverters serially connected;

a feedback capacitance connected in parallel with said inverter circuit;

an input capacitance connected to said input of said in inverter circuit for inputting a voltage;

a first refresh switch connected in parallel with said feedback capacitance for short-circuiting said feedback capacitance when in a refresh mode;

a second refresh switch connected to said input capacitance for inputting a refresh voltage equal to a threshold voltage of said inverter circuit to said input of said inverter circuit when in the refresh mode;

a first sleep switch for connecting a first sleep voltage to a terminal of one of said CMOS inverters of said inverter circuit when in a sleep mode;

a second sleep switch connected to said input of said input capacitance which connects a second sleep voltage to said input capacitance when in the sleep mode, said first and second sleep voltages corresponding to a polarity relationship between said terminal of said CMOS inverter and said input of said input capacitance, wherein said first sleep switch is connected to an output of said inverter circuit.

11. An inverting amplifying circuit as claimed in claim 10, wherein said first and second sleep voltages are a ground voltage.

12. An inverting amplifying circuit as claimed in claim 10, wherein said first and second sleep voltages are a supply voltage.

13. An inverting amplifying circuit as claimed in claim 10, wherein one or more of said CMOS inverters are substituted by logic gates.

14. An inverting amplifying circuit as claimed in claim 1, wherein said sleep switch is controlled by a sleep signal passing through a gate circuit which invalidates said sleep signal when in the refresh mode.

15. An inverting amplifying circuit comprising:

an inverter circuit having an input and an output, said inverter circuit comprising an odd number of CMOS inverters serially connected;

a feedback capacitance connected in parallel with said inverter circuit;

an input capacitance connected to said input of said in inverter circuit for inputting a voltage;

a first refresh switch connected in parallel with said feedback capacitance for short-circuiting said feedback capacitance when in a refresh mode;

a second refresh switch connected to said input capacitance for inputting a refresh voltage equal to a threshold voltage of said inverter circuit to said input of said inverter circuit when in the refresh mode;

a first sleep switch for connecting a first sleep voltage to a terminal of one of said CMOS inverters of said inverter circuit when in a sleep mode.

wherein each of said CMOS inverters are substituted by a serial circuit comprising a pMOS transistor and an nMOS transistor, one of said pMOS or nMOS transistors has the same polarity of each serial circuit connected at its gate to said input capacitance, and the other of said pMOS or nMOS transistor of each serial circuit is connected at its gate to a variable bias voltage.

16. An inverting amplifying circuit comprising:

an inverter circuit having an input and an output, said inverter circuit comprising an odd number of CMOS inverters serially connected;

a feedback capacitance connected in parallel with said inverter circuit;

an input capacitance connected to said input of said in inverter circuit for inputting a voltage;

a first refresh switch connected in parallel with said feedback capacitance for short-circuiting said feedback capacitance when in a refresh mode;

a second refresh switch connected to said input capacitance for inputting a refresh voltage equal to a threshold voltage of said inverter circuit to said input of said inverter circuit when in the refresh mode;

a first sleep switch for connecting a first sleep voltage to a terminal of one of said CMOS inverters of said inverter circuit when in a sleep mode, wherein one or more CMOS inverters other than a last stage CMOS inverter are substituted by a serial circuit comprising a pMOS transistor and an nMOS transistor, one of said pMOS or nMOS inverters has the same polarity of each serial circuit connected at its gate to said input capacitance, said one or more transistors of each serial circuit is connected at its gate to a variable bias voltage, said last stage CMOS inverter is connected at its gate to a junction between one of said nMOS transistors and one of said pMOS transistors.

17. An inverting amplifying circuit as claimed in claim 16, wherein said variable bias voltage is a saturation voltage used for turning off a transistor to which said variable bias voltage is connected.

18. An inverting amplifying circuit as claimed in claim 1, further comprising an oscillation prevention circuit which prevents unexpected or unstable oscillation of a feedback system comprising said inverter circuit and said feedback capacitance.

19. An inverting amplifying circuit comprising:
   an inverter circuit having an input and an output, said inverter circuit comprising an odd number of CMOS inverters serially connected;
   a feedback capacitance connected in parallel with said inverter circuit;
   an input capacitance connected to said input of said in inverter circuit for inputting a voltage;
   a first refresh switch connected in parallel with said feedback capacitance for short-circuiting said feedback capacitance when in a refresh mode;
   a second refresh switch connected to said input capacitance for inputting a refresh voltage equal to a threshold voltage of said inverter circuit to said input of said inverter circuit when in the refresh mode;
   a first sleep switch for connecting a first sleep voltage to a terminal of one of said CMOS inverters of said inverter circuit when in a sleep mode; and
   an oscillation prevention circuit which prevents unexpected or unstable oscillation of a feedback system, said oscillation prevention circuit comprising:
      said inverter circuit,
      said feedback capacitance, and
      a resistance and a capacitance serially connected, said oscillation prevention circuit being connected between a gate and a source of a transistor of said inverter circuit to which said input capacitance is connected.

20. An inverting amplifying circuit as claimed in claim 19, said resistance being a MOS resistance.

21. An inverting amplifying circuit comprising:
   an inverter circuit having an input and an output, said inverter circuit comprising an odd number of CMOS inverters serially connected;
   a feedback capacitance connected in parallel with said inverter circuit;
   an input capacitance connected to said input of said in inverter circuit for inputting a voltage;
   a first refresh switch connected in parallel with said feedback capacitance for short-circuiting said feedback capacitance when in a refresh mode;
   a second refresh switch connected to said input capacitance for inputting a refresh voltage equal to a threshold voltage of said inverter circuit to said input of said inverter circuit when in the refresh mode;
   a first sleep switch for connecting a first sleep voltage to a terminal of one of said CMOS inverters of said inverter circuit when in a sleep mode;
   an oscillation prevention circuit which prevents unexpected or unstable oscillation of a feedback system, said oscillation prevention circuit being connected between a transistor of said inverter circuit to which said input capacitance is connected and one or more CMOS inverters other than the last stage.

22. An inverting amplifying circuit comprising:
   an inverter circuit having an input and an output, said inverter circuit comprising an odd number of CMOS inverters serially connected;
   a feedback capacitance connected in parallel with said inverter circuit and directly to said output of said inverter circuit;
   an input capacitance connected to said input of said inverter circuit for inputting a voltage to said inverter circuit;
   a first refresh switch connected in parallel with said feedback capacitance for short-circuiting said feedback capacitance when in a refresh mode;
   a second refresh switch connected to said input capacitance for inputting a refresh voltage equal to a threshold voltage of said inverter circuit to said input of said inverter circuit when in the refresh mode; and
   a first sleep switch which connects a terminal of one of said CMOS inverters of said inverter circuit directly to a ground voltage or a saturation voltage when in a sleep mode.

23. An inverting amplifying circuit as claimed in claim 16, further comprising an oscillation prevention circuit which prevents unexpected or unstable oscillation of a feedback system comprising said inverter circuit and said feedback capacitance.

* * * * *